United States Patent [19]

Ashley

[11] 4,088,961

[45] May 9, 1978

[54] OPERATIONAL AMPLIFIER DRIVER CIRCUIT

[75] Inventor: Albert H. Ashley, Holliston, Mass.

[73] Assignee: GTE Sylvania Incorporated, Stamford, Conn.

[21] Appl. No.: 812,112

[22] Filed: Jul. 1, 1977

[51] Int. Cl.² ............................................. H03F 3/60
[52] U.S. Cl. ...................................... 330/53; 330/84; 330/104; 330/258
[58] Field of Search .................... 330/53, 84, 103, 104, 330/149, 258, 286, 295

[56] References Cited

U.S. PATENT DOCUMENTS 3,516,006   6/1970   Donjon ............................... 330/84 X Primary Examiner—James B. Mullins
Attorney, Agent, or Firm—Peter Xiarhos

[57] ABSTRACT

An operational amplifier driver circuit for supplying an undistorted ac signal to a resistive load connected across a balanced pair of twisted transmission lines where the balanced lines have common mode noise signals thereon due to the presence of substantial noise of an external, uncontrolled nature. The driver circuit includes a pair of operational amplifiers interconnected to utilize the common mode noise signals in feedback paths thereof whereby the operational amplifiers are able to operate in their linear ranges even in the presence of high levels of common mode signals on the balanced lines, thereby compensating for the effects of the common mode noise signals on the balanced lines.

6 Claims, 1 Drawing Figure

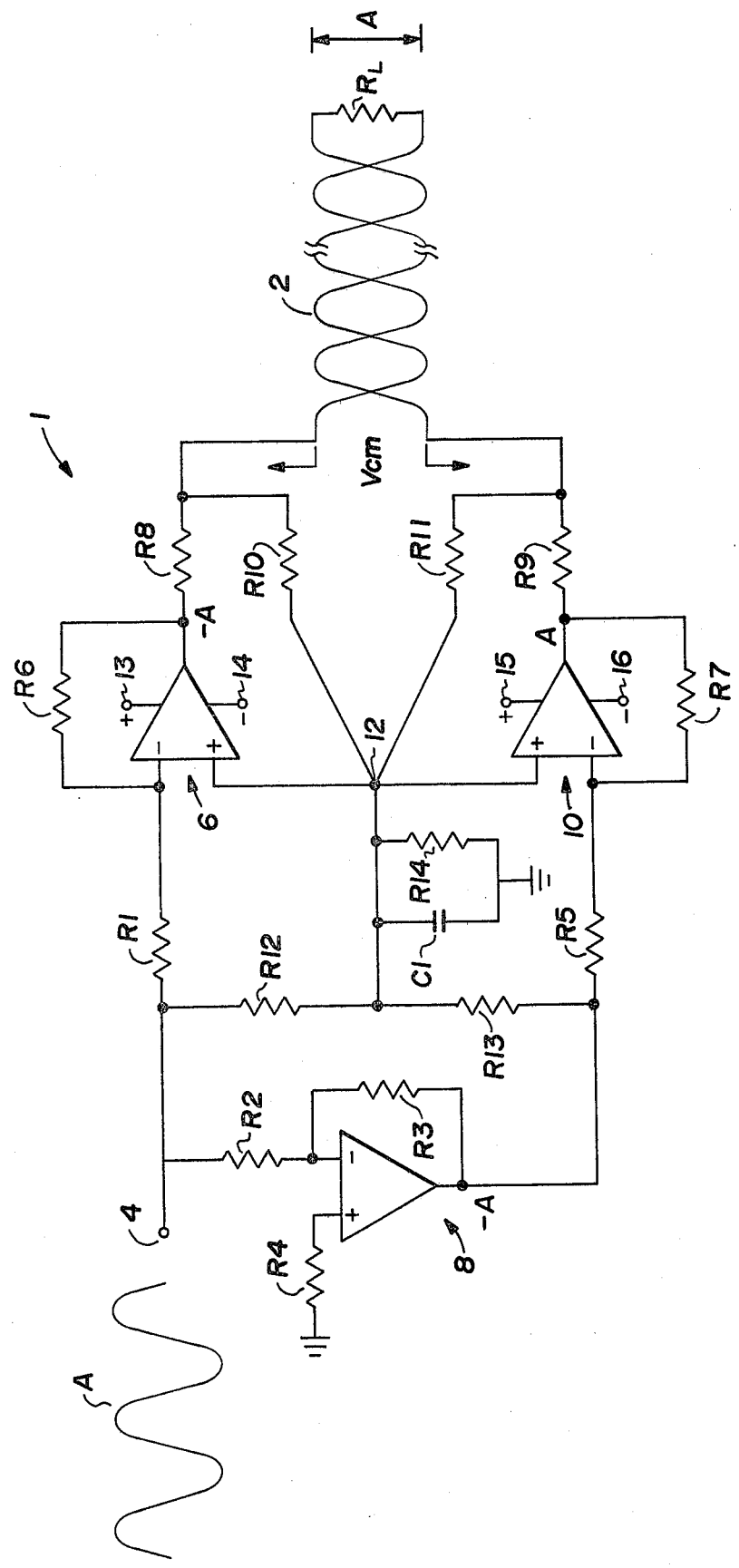

OPERATIONAL AMPLIFIER DRIVER CIRCUIT

The invention herein described was made in the course of a contract with the Department of the Army.

BACKGROUND OF THE INVENTION

The present invention relates to an amplifier driver circuit and, more particularly, to an operational amplifier driver circuit for supplying an undistorted ac signal to a resistive load connected across a balanced of twisted transmission lines on which substantial noise is present.

There are many applications, such as in telephony applications, in which it is desired to supply an undistorted ac voltage signal to a resistive load over balanced transmission lines such as twisted-pair transmission lines. The twisted-pair lines are often quite long, for example, two to three miles long, and are ordinarily subjected to substantial noise of an external, uncontrolled nature. The effect of this noise is to establish signals on the lines, commonly referred to as common mode signals, which, depending on the level of the common mode signals, cause the ac voltage appearing across the resistive load to be distorted or lost. The present invention is directed to a solution to the abovementioned problem.

BRIEF SUMMARY OF THE INVENTION

In accordance with the present invention an operational amplifier driver circuit is provided by which a signal may be applied to a load connected across a pair of twisted transmission lines despite the presence on the transmission lines of common mode signals due to the presense of noise of an external, uncontrolled nature.

The driver circuit of the invention includes first and second operational amplifier means each having a predetermined linear operating range and each having an inverting input, a non-inverting input, and an output. An input means couples a first signal, for example, a signal designated A, to the inverting input of the first operational amplifier means and a second signal, for example, a signal designated −A, to the inverting input of the second operational means. The first and second operational amplifier means cooperate with a number of resistance elements including first and second resistances connected to the outputs of the first and second operational amplifier means, respectively, and to corresponding ones of the pair of transmission lines, and third and fourth resistances connected in series with the first and second resistances, respectively, and a common juncture, the common juncture being connected to the non-inverting inputs of the first and second operational amplifier means. A resistance network is also connected to the abovementioned juncture and cooperates with the third and fourth resistances to reduce by a predetermined percentage common mode signals present on the transmission lines and to apply the reduced common mode signals to the non-inverting inputs of the first and second operational amplifier means.

The first and second operational amplifier means and the first, second, third and fourth resistances operate in response to signals A and −A coupled to the inverting inputs of the first and second operational amplifier means to supply a signal A across the load connected across the pair of transmission lines. The first and second operational amplifier means further operate in response to reduced common mode signals at their non-inverting inputs to produce voltages at their outputs and establish currents through the first and second resistances having values within the linear operating ranges of the first and second operational amplifier means. These latter currents serve to compensate for the effects of the common mode signals on the pair of transmission lines.

BRIEF DESCRIPTION OF THE DRAWING

The single FIGURE of the drawing illustrates an operational amplifier driver circuit in accordance with the present invention.

DETAILED DESCRIPTION OF THE INVENTION

Referring now to the single FIGURE of the drawing, there is shown an operational amplifier driver circuit 1 as employed in accordance with the present invention to supply an ac voltage signal A to a resistive load $R_L$ connected across a twisted pair of transmission lines 2. The transmission lines 2 in a typical application may have a length of two to three miles.

The operational amplifier driver circuit 1 as shown in the drawing includes an input terminal 4 to which an ac voltage signal A is applied to be utilized by the resistive load $R_L$. The input terminal 4 is connected via an input resistor R1 to the inverting input of a first operational amplifier R1 6 and also via a similar input resistor R2 to the inverting input of a second operational amplifier 8. The second operational amplifier 8 is connected in the circuit 1 as a standard inverter for inverting the signal A at the input terminal 4 and, for this reason, has a feedback resistor R3 connected between its inverting input and its output and an offset compensation resistor R4 connected between its non-inverting input and ground potential. The value of the feedback resistor R3 is made to be the same as that of the input resistor R2 so that the gain of the second operational amplifier 8, expressed by R3/R2, has a value of 1. The input signal A, therefor, is inverted by the operational amplifier 8 and appears at the output of the operational amplifier 8 as −a.

The inverted output signal −A of the second operational amplifier 8 is coupled to the inverting input of a third operational amplifier 10 by an input resistor R5 while, at the same time, the non-inverted input signal A is coupled to the inverting input of the first operational amplifier 6. The operational amplifiers 6 and 10 further have feedback resistors R6 and R7 respectively connected between their outputs and their inverting inputs with the values of the resistor pairs R1, R6 and R5, R7 being the same so that both of the operational amplifiers 6 and 10 have gains of 1 with respect to the signals A and −A. The outputs of the operational amplifiers 6 and 10 are connected to the balanced transmission lines 2 through respective like-valued resistors R8 and R9 (R8=R9) and also through additional like-valued resistors R10 and R11 (R10=R11) to a common connecting point or juncture 12. The juncture 12 is connected directly to the noninverting inputs of the operational amplifiers 6 and 10. Voltages (dc) for operating the operational amplifiers 6 and 10 are supplied in a conventional fashion to positive and negative supply terminals 13, 14 of the operational amplifier 6 and positive and negative supply terminals 15, 16 of the operational amplifier 10.

The circuit 1 as described above further includes a pair of like-valued resistors R12 and R13 (R12=R13) connected in series between the input terminal 4 and the output of the inverting operational amplifier 8, with the juncture of the resistors R12 and R13 being connected to the juncture 12. A capacitor C1 and a resistor R14 are also connected between the juncture 12 and ground potential. The capacitor C1 and the resistors R12–R14 are employed to reduce the positive feedback (via the resistors R10 and R11) to less than unity for gain stabilization at all frequencies (to prevent the circuit 1 from oscillating). As an alternative form for the resistors R12–R14, the resistors may be replaced by a single resistor of appropriate value and connected across the capacitor C1.

In the operation of the circuit 1 as described above, the signals A and −A coupled to the inverting inputs of the operational amplifiers 6 and 10, as previously discussed, are inverted by the operational amplifiers 6 and 10 (with a gain of 1) and appear at the outputs thereof as −A and A, respectively. Due to the symmetrical nature and related values of the various resistors R8–R13 (that is, R8=R9, R10=R11, R12=R13), the signals A and −A are caused to be halved to −A/2 and A/2, but become additive and appear across the load $R_L$ as the signal A. The resistors R8, R9, R10 and R11, again by virtue of their related values and symmetry, further serve to establish a zero volt condition at the juncture 12 and, thus, at the non-inverting inputs of the operational amplifiers 6 and 10. As a result, the gain of both operational amplifiers 6 and 10 remains at 1. However, as the operational amplifiers 6 and 10 operate as described above with reference to the signals A and −A, common mode signals are present on the transmission lines 2 due to the presence on the lines of substantial noise of an external, uncontrolled nature. The common mode signals, which may be represented by $V_{cm}$, may have a typical value of up to 10 volts and unless the effects thereof are compensated for or eliminated, the signal A across the load $R_L$ is subject to being distorted or lost. In accordance with the present invention, the potential unwanted effects of the common mode signals $V_{cm}$ are eliminated by the provision of the resistors R10 and R11 in respective feedback paths to the non-inverting inputs of the operational amplifiers 6 and 10 and also by the provision of the resistors R12–R14. The common mode signals $V_{cm}$ are coupled by the resistors R10 and R11 to the juncture 12 and attenuated by about one half at the juncture 12 (due to the aforementioned resistors R10–R14). The attenuated common mode signals at the juncture 12 are then amplified by the operational amplifiers 6 and 10 by the value of gain between the juncture 12 and the outputs of the amplifiers 6 and 10 (R1+R6/R1), a typical value of gain being 2. By way of specific example, for common mode signals $V_{cm}$ of 10 volts ac, operational amplifiers 6 and 10 of a type CA3100 used with resistors R1, R5, R6 and R7 of a value of 4.99 Kilohms, and values for the resistors R10–R13 of 4.99 Kilohms and 26.1 Kilohms for R14, the voltage at the juncture 12 (and at the non-inverting inputs of the amplifiers 6 and 10) is 4.77 volts and the outputs of the amplifiers 6 and 10 are at 9.54 volts. In this case, the voltage across each of the resistors R8 and R9 is 0.46 volts (10−9.54 volts). For typical values of 68.1 ohms for the resistors R8 and R9, current flows through each of the resistors R8 and R9 having a value of 6.76 milliamperes (0.46/68.1). This value of current at the output of each of the operational amplifiers 6 and 10 is very small and well within the linear operating range of the operational amplifiers 6 and 10. It is to be appreciated that without the resistors R10 and R11, the operational amplifiers 6 and 10 would try to supply current to the lines 2 in excess of their capability, for example, about 150 milliamperes for a common mode signal of 10 volts. The same effect of non-linearity would be true for levels of common mode signal as low as 1 volt ac. Thus, the output current of 6.76 milliamperes for the amplifiers 6 and 10 represents, for a common mode signal of 10 volts, about 22 to 1 improvement over the 150 milliampere output current that would exist in the absence of the resistors R10 and R11. This improvement is reduced to about 10 to 1 at a frequency of input signals of about 70 KHz, by virtue of the use of the capacitor C1 (to prevent oscillation of the circuit 1), but this value is quite acceptable since most common mode signals are relatively low frequency, for example, in the audio range or lower.

Remaining suitable values for the components of the circuit 1 as described above are as follows:

R2 - 4.99 Kilohms
R3 - 4.99 Kilohms
R4 - 2.7 Kilohms
$R_L$ - 135 ohms ($R_L$=R8+R9)
Operational amplifier 8 - Type 4131

While there has been described what is considered to be a preferred embodiment of the invention, it will be apparent to those skilled in the art that various changes and modifications may be made therein without departing from the invention as called for in the appended claims.

What is claimed is:

1. An operational amplifier driver circuit for supplying a signal A to a load connected across a pair of twisted transmission lines, said transmission lines having common mode signals thereon due to the presence of noise of an external, uncontrolled nature, said driver circuit comprising:

first and second operational amplifier means each having a predetermined linear operating range and each having an inverting input, a non-inverting input, and an output;

input means for coupling a signal A to the inverting input of the first operational amplifier means and a signal −A to the inverting input of the second operational amplifier means;

first and second resistances connected to the outputs of the first and second operational amplifier means, respectively, and to corresponding ones of the pair of transmission lines;

third and fourth resistances connected in series with the first and second resistances, respectively, and with a common juncture, said juncture being connected to the non-inverting inputs of both the first and second operational amplifier means;

a resistance network connected to the juncture of the third and fourth resistances;

said third and fourth resistances and said resistance network being operative to reduce by a predetermined percentage common mode signals present on the transmission lines and to apply the reduced common mode signals to the non-inverting inputs of the first and second operational amplifiers means;

said first and second operational amplifier means and said first, second, third and fourth resistances being operative in response to signals A and −A coupled to the inverting inputs of the first and second operational amplifier means to supply a signal A across the load connected across the pair of transmission lines, and said first and second operational amplifier means being operative in response to reduced common mode signals at their non-inverting inputs to produce voltages at their outputs and establish currents through the first and second resistances having values within the linear operating ranges of the first and second operational amplifier means, thereby to compensate for the effects of the common mode signals on the pair of transmission lines.

2. An operational amplifier drive circuit in accordance with claim 1 wherein:
the first and second resistances are of like value; and
the third and fourth resistances are of like value.

3. An operational amplifier driver circuit in accordance with claim 2 further comprising:
fifth and sixth resistances connected in feedback paths between the outputs and inverting inputs of the first and second operational amplifier means, respectively.

4. An operational amplifier driver circuit in accordance with claim 3 wherein the input means comprises:
an input terminal adapted to receive a signal A;
a resistance connected between the input terminal and the inverting input of the first operational amplifier means and operative to couple a signal A at the input terminal to the inverting input of the first operational amplifier means;
inverting circuit means coupled to the input terminal and having an output, said inverting circuit being operative to invert a signal A at the input terminal to a signal −A at its output; and
a resistance connected between the output of the inverting circuit means and the inverting input of the second operational amplifier means and operative to couple a signal −A at the output of the inverting circuit means to the inverting input of the second operational amplifier means.

5. An operational amplifier driver circuit in accordance with claim 4 wherein the resistive network comprises:
a pair of resistances connected in series between the input terminal of the input means and the output of the inverting circuit means of the input means; and
a resistance connected between the juncture of the abovesaid pair of resistances and a source of reference potential.

6. An operational amplifier driver circuit in accordance with claim 5 wherein the inverting circuit means comprises:
an operational amplifier having an inverting input, a non-inverting input and an output;
a resistance connected between the input terminal and the inverting input of the operational amplifier;
a feedback resistance connected between the inverting input and the output of the operational amplifier; and
a resistance connected between the non-inverting input of the operational amplifier and a source of reference potential.

* * * * *